United States Patent
Hsu et al.

(10) Patent No.: US 8,754,504 B2
(45) Date of Patent: Jun. 17, 2014

(54) THINNED WAFER AND FABRICATING METHOD THEREOF

(75) Inventors: Chang-Sheng Hsu, Hsinchu (TW);
Kuo-Yuh Yang, Hsinchu County (TW);
Kuo-Hsiung Huang, Hsinchu County (TW); Yan-Da Chen, Taipei (TW);
Chia-Wen Lien, Taoyuan County (TW)

(73) Assignee: United Microelectronics Corporation, Hsinchu (TW)

( * ) Notice: Subject to any disclaimer, the term of this patent is extended or adjusted under 35 U.S.C. 154(b) by 82 days.

(21) Appl. No.: 13/478,223

(22) Filed: May 23, 2012

(65) Prior Publication Data
US 2013/0313691 A1    Nov. 28, 2013

(51) Int. Cl.
*H01L 29/06*    (2006.01)

(52) U.S. Cl.
USPC .................. 257/619; 257/618; 257/E23.179; 438/462

(58) Field of Classification Search
CPC ....... H01L 29/06; H01L 23/544; H01L 21/78; H01L 21/561; H01L 2224/94; H01L 21/30604; H01L 21/308; H01L 21/31144; H01L 2223/54453
USPC .......... 257/618, 619, 620, E23.179; 438/113, 438/460, 462, 928
See application file for complete search history.

(56) References Cited

U.S. PATENT DOCUMENTS

| | | | |
|---|---|---|---|
| 6,706,549 B1 * | 3/2004 | Okojie | 438/52 |
| 8,011,513 B2 | 9/2011 | Neo et al. | |
| 8,384,170 B2 * | 2/2013 | Getman et al. | 257/419 |
| 2005/0109081 A1 * | 5/2005 | Zribi et al. | 73/31.05 |
| 2005/0248905 A1 * | 11/2005 | Ruohio et al. | 361/283.4 |
| 2008/0248730 A1 | 10/2008 | Priewasser | |
| 2010/0108893 A1 | 5/2010 | Flitsch et al. | |
| 2010/0252915 A1 | 10/2010 | Wood et al. | |

OTHER PUBLICATIONS

Landesberger et, al., "Carrier techniques for thin wafer processing", May 14-17, 2007, pp. 33-36, CS MANTECH Conference, Austin, Texas, USA.
Gerald Klug, "Advanced Solutions for Ultra-Thin Wafers and Packaging", 2009, Microelectronics and Packaging Conference.

* cited by examiner

*Primary Examiner* — Eduardo A Rodela
(74) *Attorney, Agent, or Firm* — WPAT, PC; Justin King

(57) ABSTRACT

A thinning method of a wafer is provided. The method includes the following steps. First, a wafer having a first surface, a second surface, and a side surface is provided, and the side surface is connected between the first surface and the second surface. At least one semiconductor device is formed on the first surface. Then, an anisotropy etching process is performed to the second surface with a mask to remove portions of the wafer while remaining the side surface thereby forming a number of grooves in the second surface and at least one reinforcing wall between the grooves. As a result, a thinned wafer is obtained.

13 Claims, 11 Drawing Sheets

THINNED WAFER AND FABRICATING METHOD THEREOF

TECHNICAL FIELD

The present invention relates generally to a thinning method of a wafer and a thinned wafer.

BACKGROUND

To meet the requirement of reducing the fabricating cost, the number of semiconductor devices in a single wafer and the diameter of the wafer are continuously increased. As the diameter of the wafer is bigger and bigger, the thickness of the wafer is also required to be increased to ensure that the wafer is capable of enduring the stress in various fabricating processes of the semiconductor devices. Accordingly, after the semiconductor devices are formed on the front surface, a thinning process to the back surface is required if some processes such as ion implantation, high temperature annealing and forming back electrodes are intended to be performed on the back surface. Generally, the thinning process includes grinding the back surface with a tool, and two typical grinding methods of the wafer are described below accompanying with figures.

FIGS. 1A and 1B are schematic views of a full grinding method of a wafer. As shown in the side view of FIG. 1A, a wafer 100 includes a first surface 110 and a second surface 120. The first surface 110 is bonded to a temporary bonding layer T1 thereby fixing the wafer 100 onto a carrier C1. Then, the second surface 120 is entirely grinded with a grinding tool G1 to thin the wafer 100. Referring to FIG. 1B, a side view of a thinned wafer 101 which is bonded to a temporary bonding layer T1 fixed on the carrier C1 is shown.

As described above, the wafer can be thinned with the above full grinding method. However, the temporary bonding layer should be used in the above method, and the temporary bonding layer will lost viscosity when the temperature exceed to a value such as 260 degrees centigrade. That is, when the process temperature is higher than 260 degrees centigrade, the thinned wafer can't be fixed on the carrier and transported to the next process.

FIGS. 2A and 2B are schematic views of a partial grinding method of a wafer. As shown in the side view of FIG. 2A, a wafer 100 includes a first surface 110 and a second surface 120. The wafer 100 is fixed on a carrier C2. Then, a region of the second surface 120 (i.e., the region in the dashed lines) is grinded with a grinding tool G2 while a peripheral region (i.e., the region outside the dashed lines) is remained. Referring to FIG. 2B, a side view of a thinned wafer 102 is shown.

In the partial grinding method, the wafer can be thinned, and the remained peripheral portion of the wafer can be used as a supporting structure to transport the thinned wafer to a next work station. However, only a part of the second surface is grinded, and thus warpage of the thinned wafer easily occurs. In addition, special equipment is needed to perform the partial grinding method. Therefore, the fabricating cost is increased.

Thus, how to overcome shortages of the above methods is the main agenda while developing the thinning method of wafer.

SUMMARY

In one embodiment, a thinning method of a wafer is provided. The method includes the following steps. First, a wafer having a first surface, a second surface, and a side surface is provided, and the side surface is connected between the first surface and the second surface. At least one semiconductor device is formed on the first surface. Then, an anisotropy etching process is performed to the second surface with a mask to remove portions of the wafer while remaining the side surface thereby forming a number of grooves in the second surface and at least one reinforcing wall between the grooves. As a result, a thinned wafer is obtained.

In another embodiment, a thinned wafer is provided. The thinned wafer includes a first surface, a second surface, and a side surface. A semiconductor device is formed on the first surface. A plurality of grooves is formed in the second surface, and at least one reinforcing wall is formed between the grooves. The side surface is connected between the first surface and the second surface.

By using the above described methods, wafers can be thinned without using special equipment, and warpage of wafers doesn't occur. In addition, the thinned wafer obtained from the method includes an excellent supporting structure that can be used to transport the thinned wafer to the next work station to perform following processes such as ion implantation, high temperature annealing and forming back electrodes.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 3A to 3E are schematic views illustrating a thinning method of a wafer and the obtained thinned wafer in accordance with a first embodiment of the present disclosure.

Figure 1A:
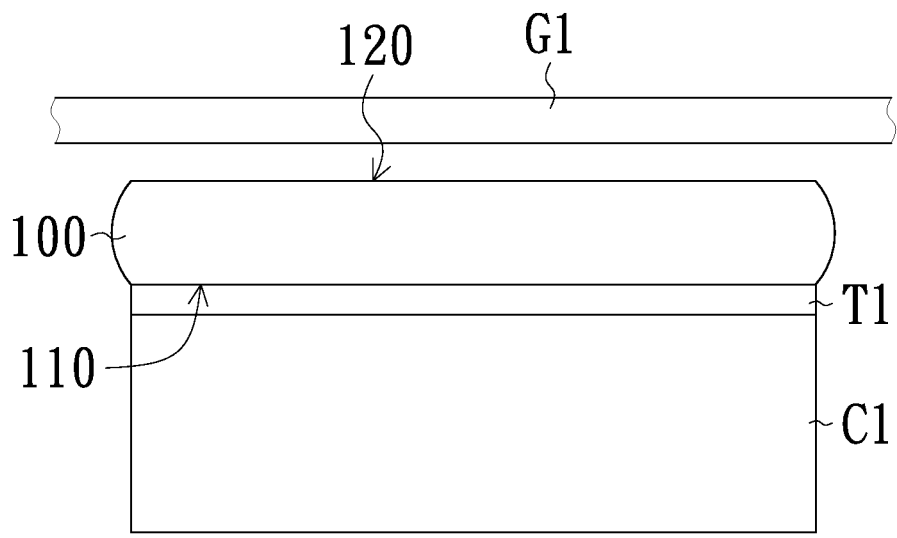
FIGS. 1A and 1B are schematic views of a full grinding method of a wafer.
Figure 1B:
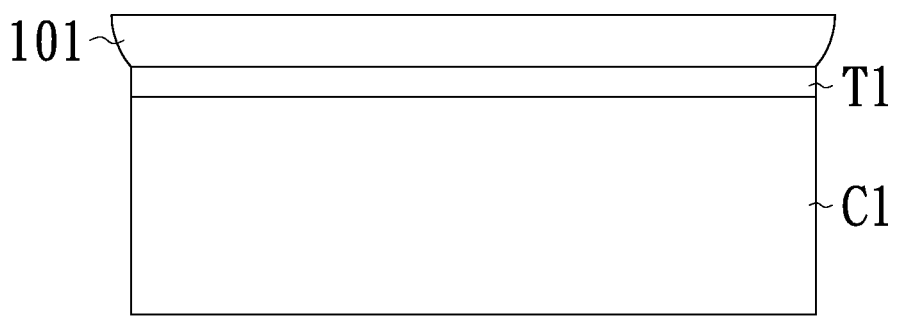
Figure 2A:
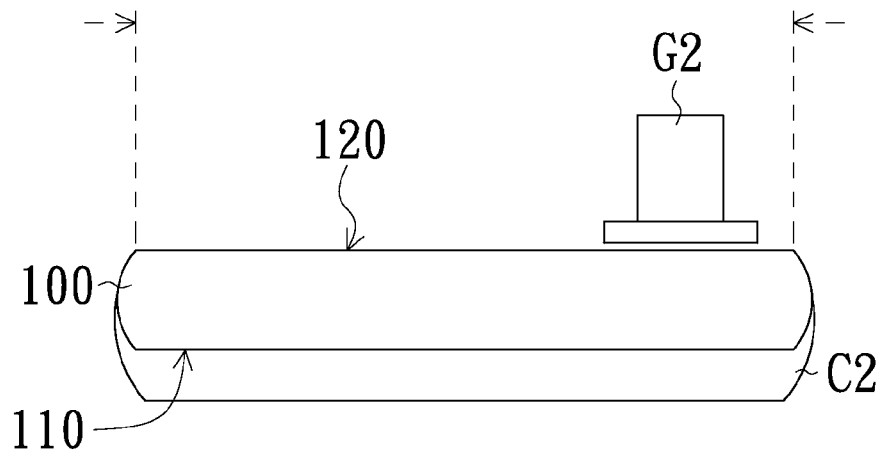
FIGS. 2A and 2B are schematic views of a partial grinding method of a wafer.
Figure 2B:
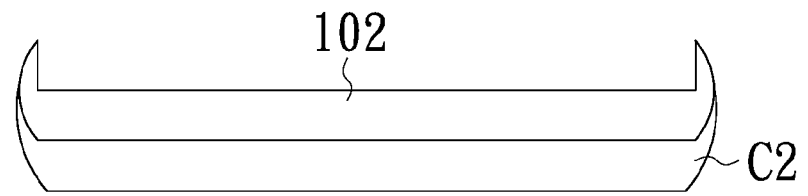
Figure 3A:
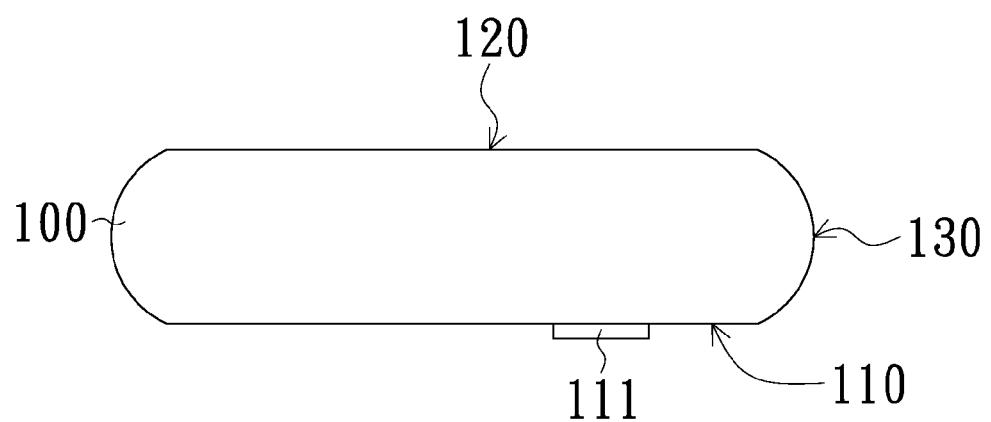
FIGS. 3A to 3E are schematic views illustrating a thinning method of a wafer and the obtained thinned wafer in accordance with a first embodiment.

Referring to the side view shown in FIG. 3A, a wafer 100 is provided. The wafer 100 includes a first surface 110, a second surface 120 and a side surface 130. A semiconductor device 111 is formed on the first surface 110. It is to be noted that, the material of the wafer can be silicon, germanium, or other semiconductors of III-V groups.

Figure 3B:
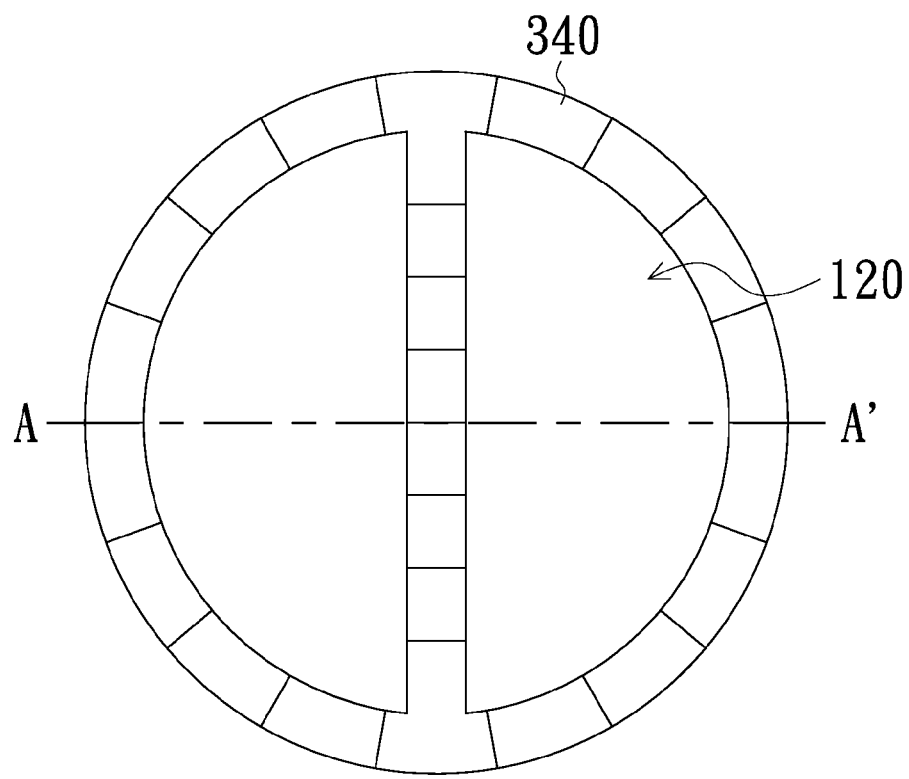
Figure 3C:
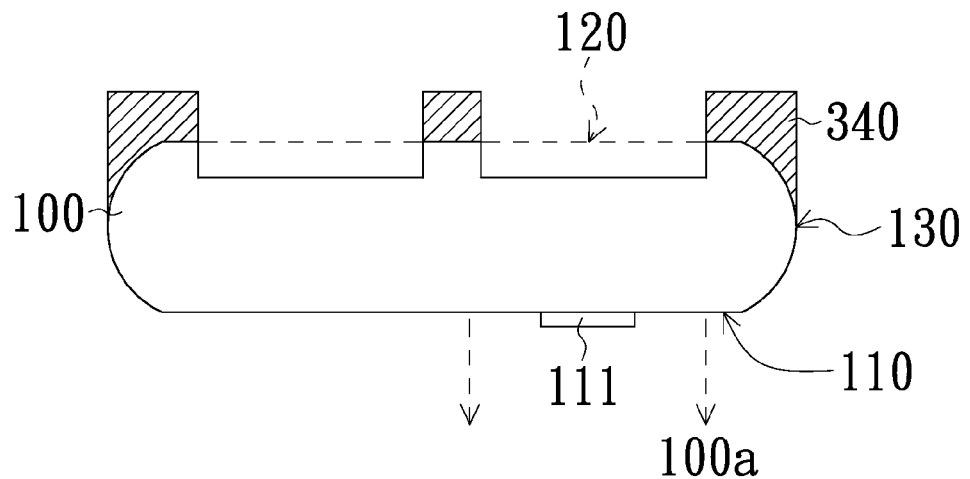

Referring to the top view shown in FIG. 3B, a mask 340 is formed on the second surface 120. In the present embodiment, the mask 340 is formed using a lithography process. Referring to FIG. 3C, which is a cross sectional view of taken along a line AA' of FIG. 3B, the mask 340 protects the side surface 130. A plasma gas anisotropy etching process is performed to the second surface 120 with the mask 340 to remove portions of the wafer 100 thereby forming a number of grooves. Employing the side surface and the reinforcing wall as a supporting structure, the thinned wafer can be easily transported to the following process. In addition, the bottoms of the grooves, which have a reduced thickness, further help to perform the following processes. For example, the following processes may be an ion implantation process to the second surface or forming the back electrodes. After these processes, the functional devices in the thinned wafer are finished. Furthermore, a bottom region 100a of each groove may cover the scribe lines defined in the wafer 100. Thus, a backside dicing process can be used to separate the thinned wafer to obtain dies, and this method further reduces the steps of the process thereby reducing the fabricating cost and improving the fabricating efficiency.

Figure 3D:
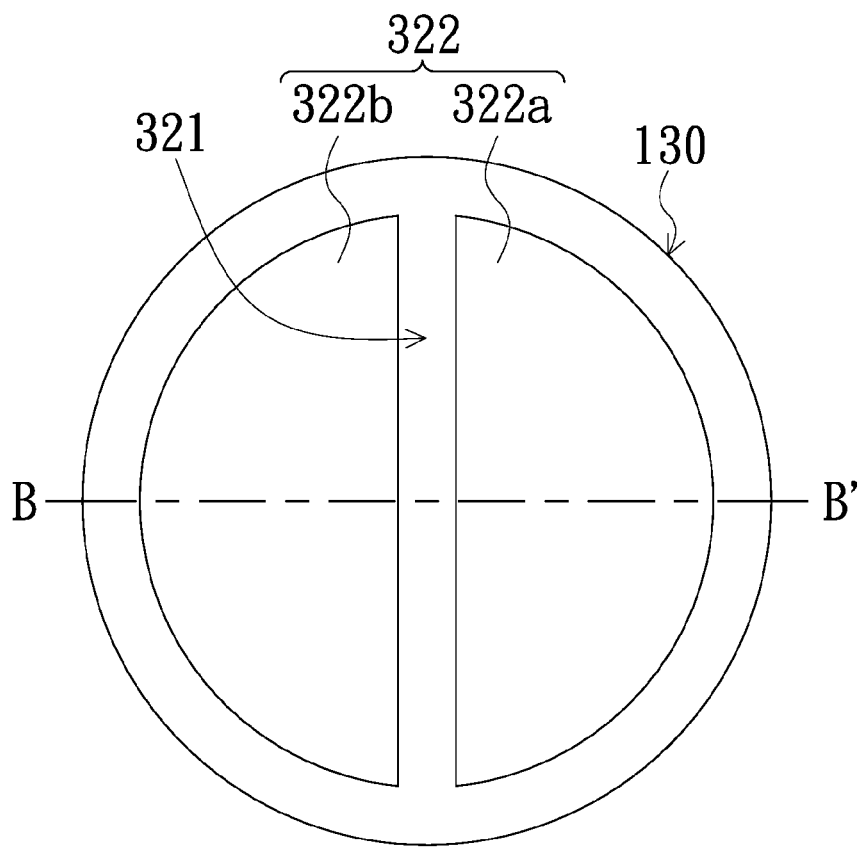

Referring to the top view shown FIG. 3D, finally, grooves 322 are formed in the second surface. The grooves 322 include a groove 322a and a groove 322b. A reinforcing wall 321 is remained between the groove 322a and the groove 322b, and the thinned wafer 103 is obtained. In the present embodiment, the first reinforcing 321 wall extends across the centre of the wafer and is connected with the side surface 130.

Figure 3E:
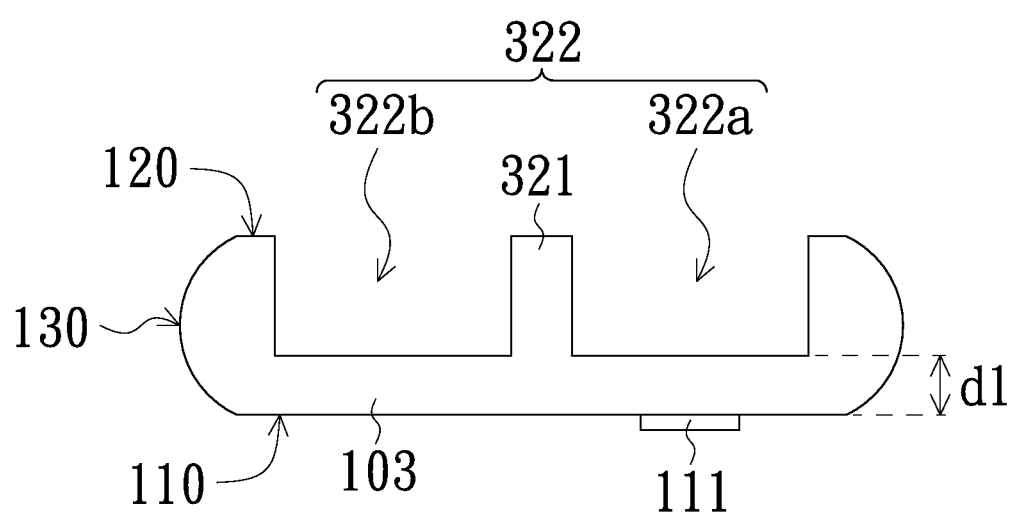

FIG. 3E is a cross sectional view of the FIG. 3D taken along a line BB'. Referring to FIG. 3E, the thinned wafer 103 includes a first surface 110 with a semiconductor device 11 formed thereon, and a second surface 120. The grooves 322 are formed in the second surface 120, and the grooves include the groove 322a and the groove 322b. A reinforcing wall 321 is remained between the groove 322a and the groove 322b. The thinned wafer 103 further includes a side surface 130 connected between the first surface 110 and the second surface 120. In the present embodiment, the above plasma anisotropy etching process is controlled such that a vertical distance d1 between the bottom of the grooves 322 and the first surface 110 is less than 400 micrometers.

FIGS. 4A to 4D are schematic views illustrating a thinning method of a wafer and the obtained thinned wafer in accordance with a second embodiment of the present disclosure.

Figure 4A:
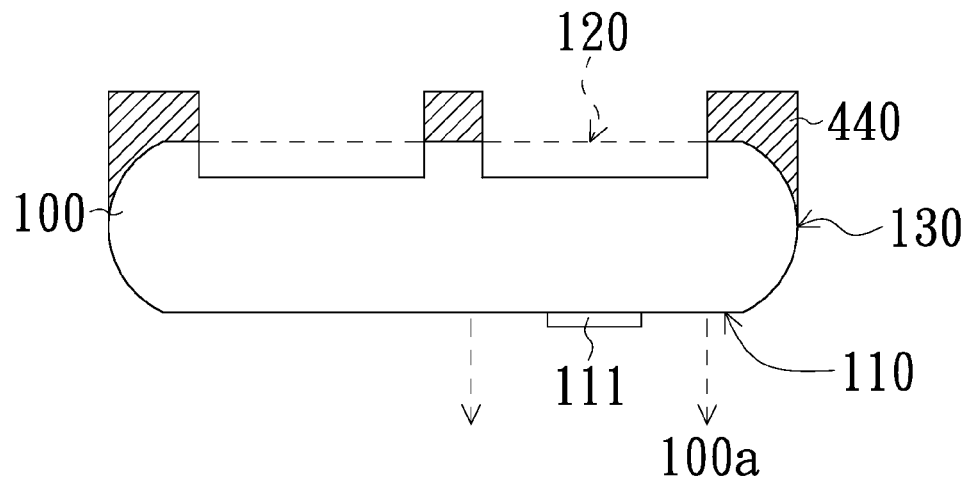
FIGS. 4A to 4D are schematic views illustrating a thinning method of a wafer and the obtained thinned wafer in accordance with a second embodiment.

FIG. 4A is similar to FIG. 3C, and illustrates a cross sectional view of a wafer 100. The wafer 100 includes a first surface 110, a second surface 120 and a side surface 130. A semiconductor device 111 is already formed on the surface 100. An anisotropy etching process is performed to the second surface 120 with the mask 340 such that portions of the wafer 100 are removed while the side surface 130 is remained.

Figure 4B:
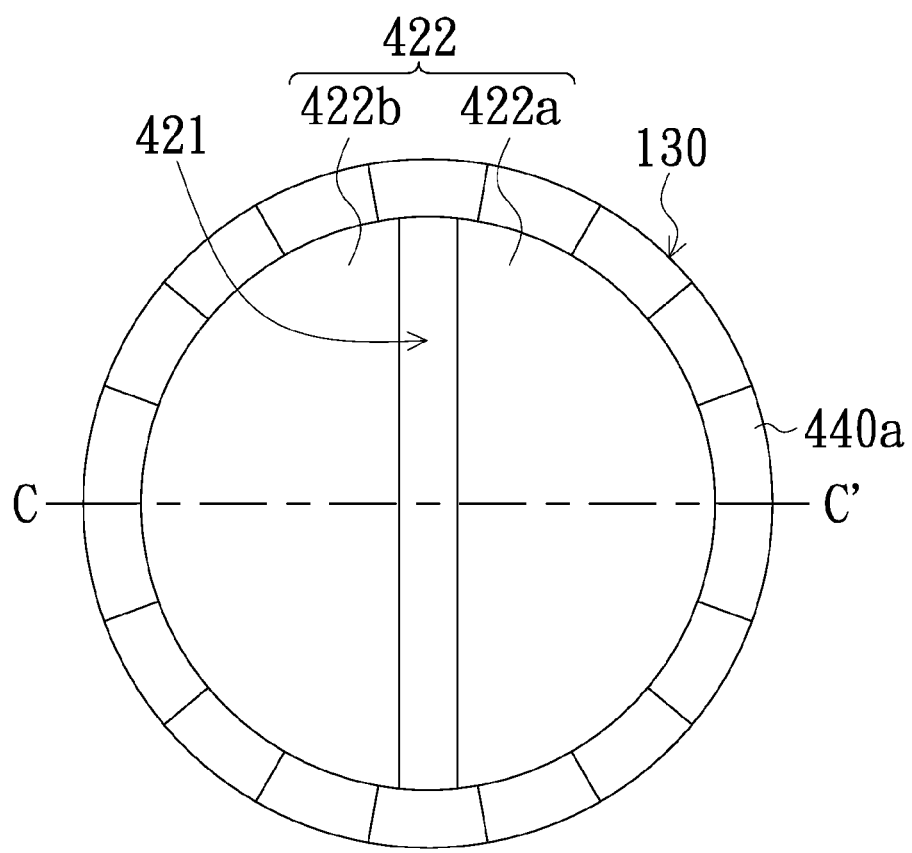

Referring the top view shown in FIG. 4B, grooves 422 are formed in the second surface. The grooves 422 include a groove 422a and a groove 422b, and a reinforcing wall 421 is remained between the groove 422a and the groove 422b. The mask above the reinforcing wall 421 is removed and a mask 440a above the side surface 130 is remained. Continuing to FIG. 4C, which is a cross sectional view of FIG. 4B taken along a line CC', the anisotropy etching process is continuously performed such that a vertical distance d2 between the top of the reinforcing wall 421 and the first surface 110 is less than a vertical distance d3 between the first surface 110 and the second surface. After that, the mask 440a is removed and a thinned wafer 104 is obtained.

Figure 4C:
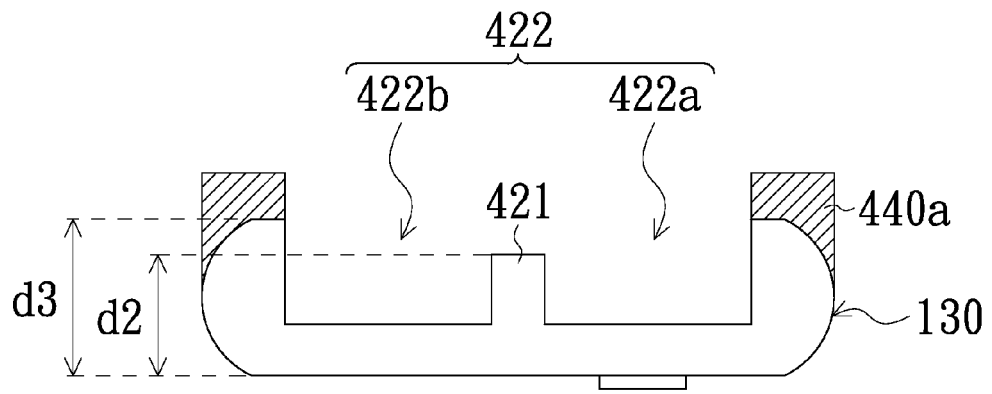
Figure 4D:
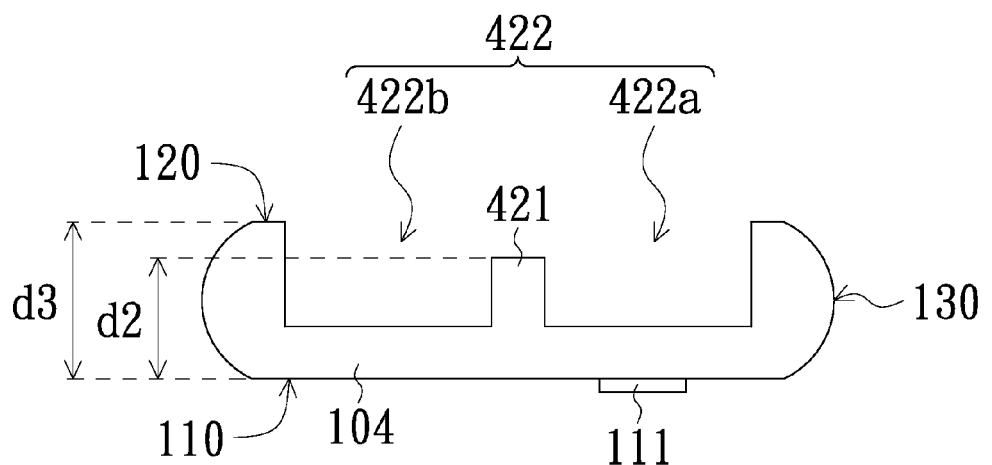

FIG. 4D is a cross sectional view similar to FIG. 4C. Referring to FIG. 4D, the thinned wafer 104 includes the first surface 110 with a semiconductor device 111 formed thereon, a second surface 120 and a side surface 130. The grooves 422 are formed on the second surface 120, and the grooves 422 include the groove 422a and the groove 422b. A reinforcing wall 421 is remained between the groove 422a and the groove 422b. The side surface 130 is connected between the first surface 110 and the second surface 120.

In the present embodiment, the vertical distance d2 between the top of the reinforcing wall 421 and the first surface 110 is less than the vertical distance d3 between the first surface 110 and the second surface 120. Compared with the first embodiment, the height of the reinforcing wall 421 is reduced, but the reinforcing wall 421 is still adequate for supporting the thinned wafer 104. The thinned wafer 104 can be easily transported to the next work station with the reinforcing wall 421 for the following processes such as ion implantation, high temperature annealing, and forming back electrodes. In addition, the following processes can be performed more easily due to the grooves 422 having a low depth-to-width ratio.

Figure 5:
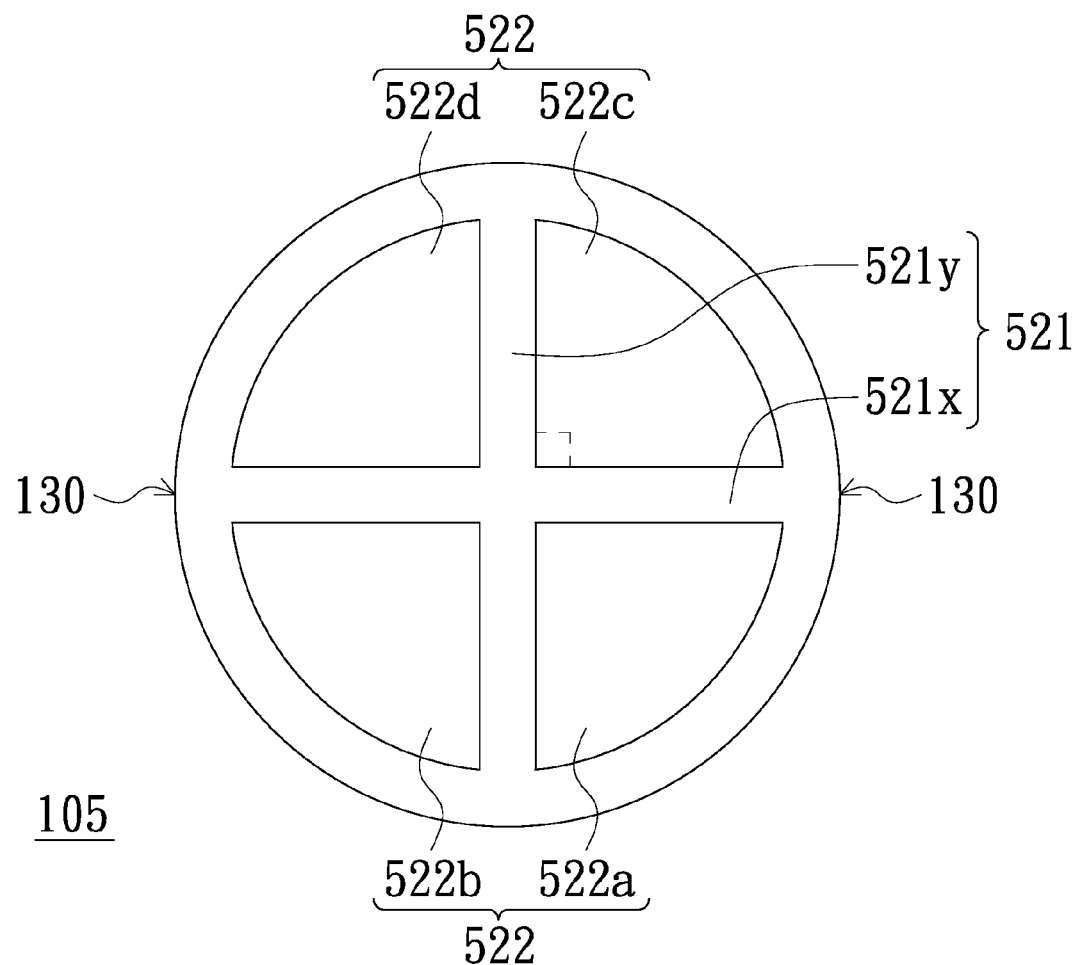
FIG. 5 is a schematic view illustrating a thinning method of a wafer and the obtained thinned wafer in accordance with a third embodiment.

FIG. 5 is a schematic view illustrating a thinning method of a wafer and the obtained thinned wafer in accordance with a third embodiment of the present disclosure.

Referring to a thinned wafer 105 shown in the top view of FIG. 5, a wafer (such as shown in FIG. 3A) is provided. An anisotropy etching process is performed to the second surface of the wafer with a mask thereby removing portions of the wafer while remaining the side surface 130. As a result, grooves 522 are formed in the second surface. The grooves 522 include a groove 522a, a groove 522b, a groove 522c and a groove 522d. In addition, a reinforcing wall 521x and a reinforcing wall 521y are formed between the grooves 522. In the present embodiment, the reinforcing wall 521x is orthogonal to the reinforcing wall 521y.

Figure 6:
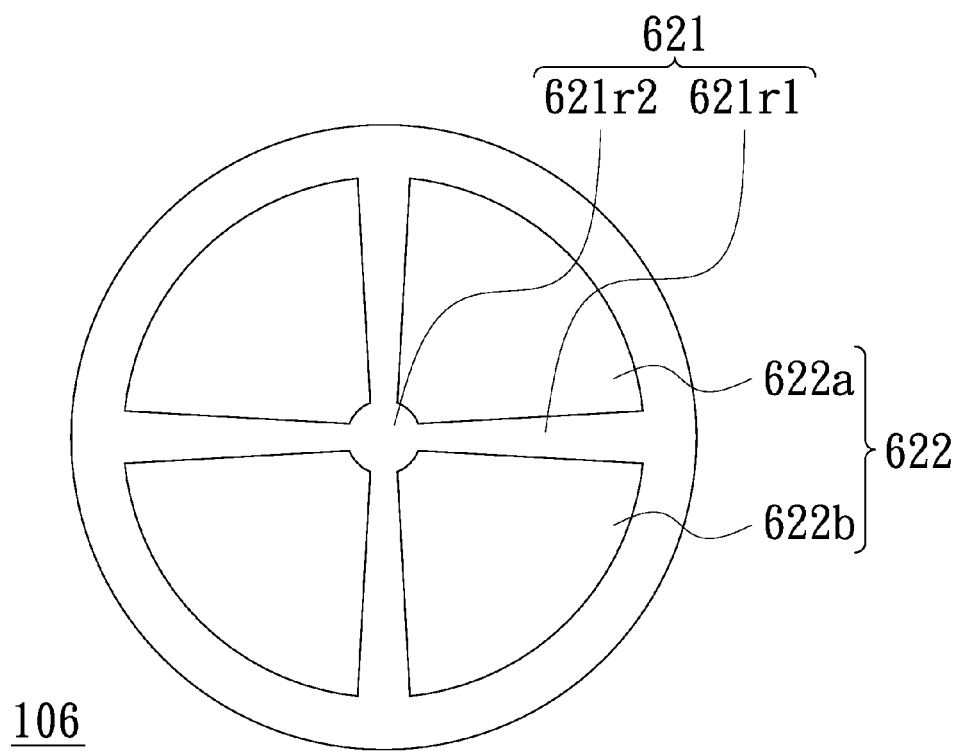
FIG. 6 is a schematic view illustrating a thinned wafer in accordance with a fourth embodiment.

FIG. 6 is a schematic view illustrating a thinned wafer in accordance with an embodiment.

Figure 7:
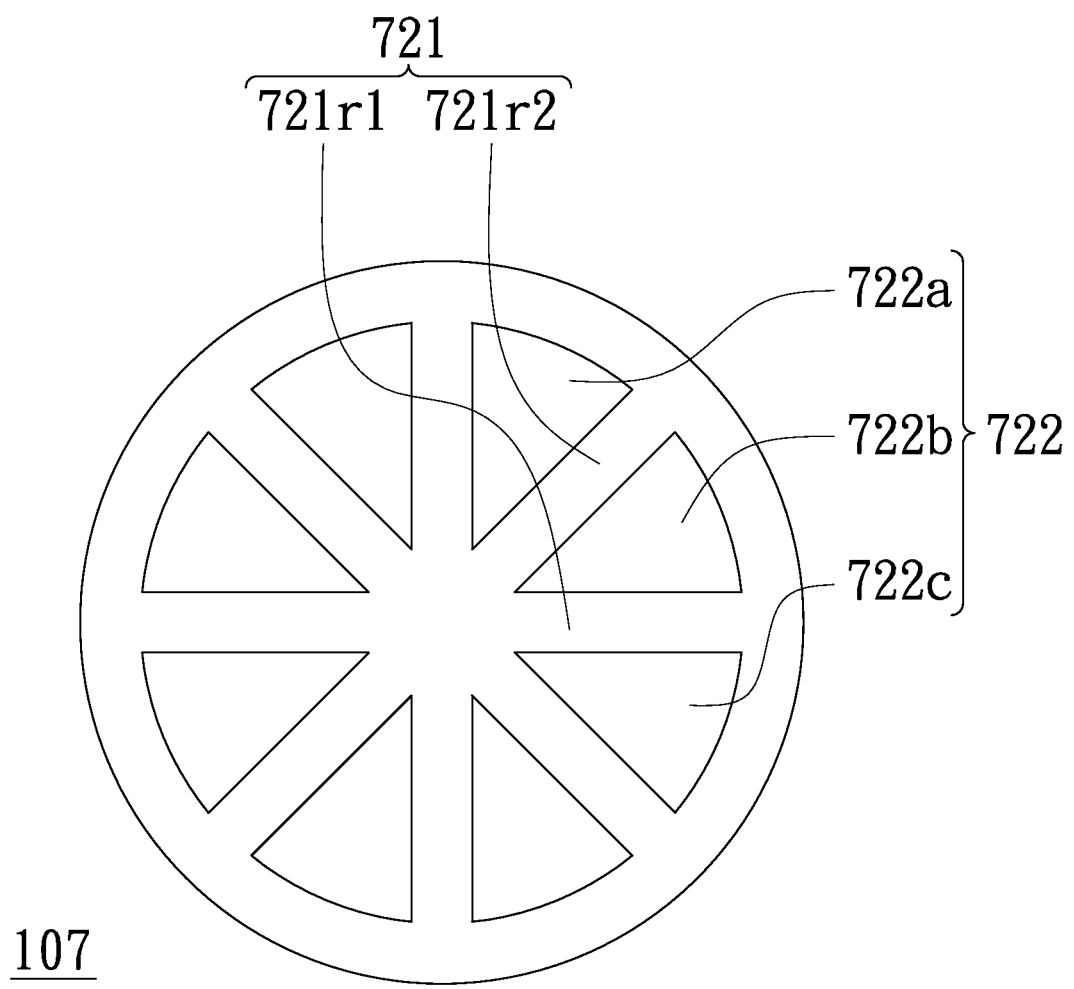
FIG. 7 is a schematic view illustrating a thinned wafer in accordance with a fifth embodiment.

Referring to a thinned wafer 106 shown in the top view of FIG. 6, there are a number of grooves 622 formed in the second surface. The grooves 622, for example, include a groove 622a and a groove 622b. The projection of the grooves 622 on the second surface is conical. It is also worthy to note that the projection of reinforcing walls 621 formed between the grooves 622 on the second surface doesn't have equal width along a lengthwise direction thereof. For example, the reinforcing wall 621 includes a reinforcing wall 621r1 having a conical projection and a reinforcing wall 622r2 having a circular projection. Referring also to a thinned wafer 107 shown in a top view of FIG. 7, there are also a number of grooves 722 formed in the second surface. The grooves 722, for example, include a groove 722a, a groove 722b, and a groove 722c. The projection of the grooves 722 on the second surface is conical. A number of reinforcing walls 721 are formed between the grooves 722. The reinforcing walls 721, for example, include a reinforcing wall 722r1 and a reinforcing wall 722r2. The projection of the reinforcing walls 721 on the second surface has equal width along a length wise direction thereof, and the reinforcing wall 721r1 is non-orthogonal to the reinforcing wall 721r2.

Figure 8:
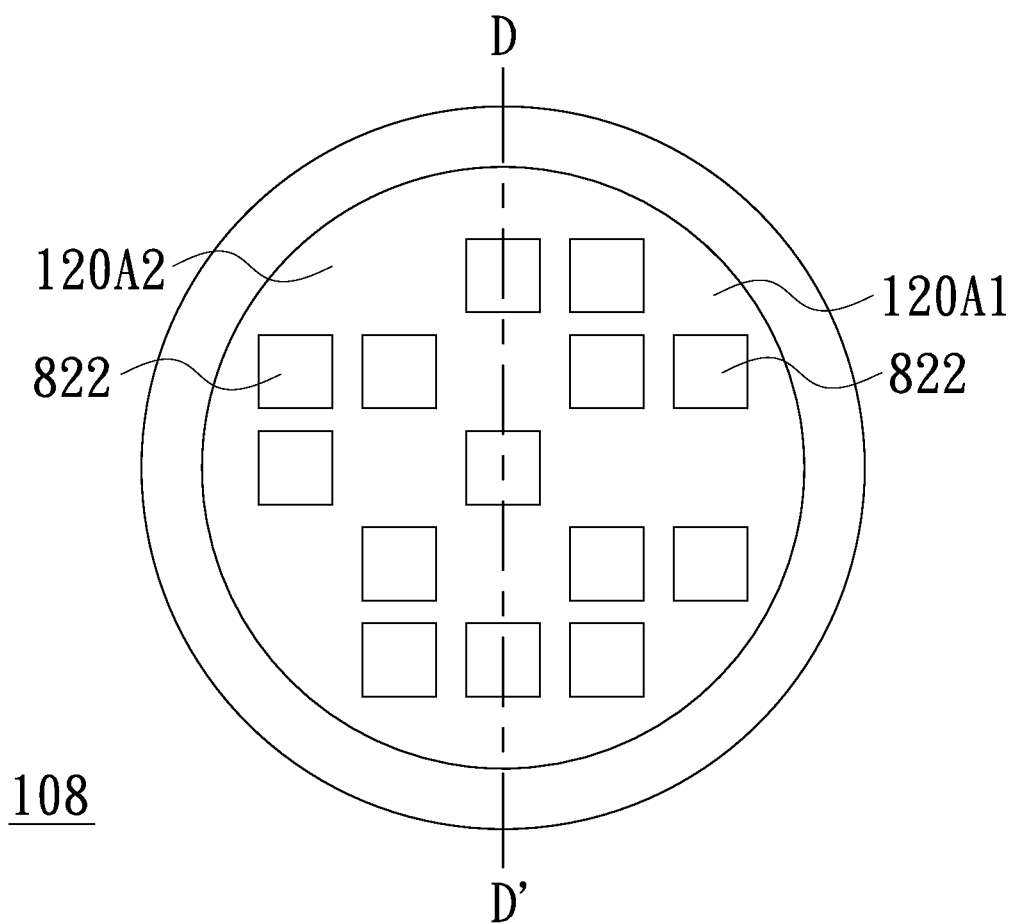
FIG. 8 is a schematic view illustrating a thinned wafer in accordance with a sixth embodiment.

Finally, referring to FIG. 8, a top view of a thinned wafer 108 is shown. The second surface can be divided into several regions of equal area. For example, the thinned wafer 108 can be divided into two regions of equal area with a hypothetical line DD'. The two regions, for example, include a region 120A1 and a region 120A2. A number of grooves 822 are formed in the second surface. The projection of the grooves 822 on the second surface is rectangular and the number of the grooves 822 is different in the region 120A1 and the region 120A2. In other words, the grooves can optionally be formed in specific areas.

In summary, by using the above described methods, wafers can be thinned without using special equipment, and warpage of wafers doesn't occur. In addition, the thinned wafer obtained from the method includes an excellent supporting structure, and the grooves and reinforcing walls of different shapes can be formed according to practical device designs or process parameters. Thus, it is easily to transport the thinned wafer to the next work station to perform following processes such as ion implantation, high temperature annealing and forming back electrodes. As a result, it is helpful for the fabricating process, reducing the fabricating cost and improving the fabricating efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A thinning method of a wafer, the method comprising:
providing a wafer having a first surface, a second surface and a side surface connected between the first surface and the second surface, a semiconductor device being formed on the first surface; and
performing an anisotropy etching process to the second surface with a mask such that portions of the wafer are removed while the side surface is remained, the anisotropy etching process forming a plurality of grooves in the second surface, and at least one reinforcing wall being formed between the grooves, wherein a bottom region of the grooves covers a scribe line defined in the wafer.

2. The thinning method of claim 1, wherein the mask is formed on the second surface by a lithography process.

3. The thinning method of claim 1, wherein the anisotropy etching process is achieved by plasma.

4. The thinning method of claim 1, wherein the anisotropy etching process is controlled such that a vertical distance between a bottom of the grooves and the first surface is greater than 0 and less than 400 micrometers.

5. The thinning method of claim 1, further comprising:
removing the mask above the reinforcing wall while remaining the mask above the side surface after the grooves are formed;
continuing to perform the anisotropy etching process to remove a portion of the reinforcing wall such that a vertical distance between a top of the reinforcing wall and the first surface is less than a vertical distance between the first surface and the second surface; and
removing the residual mask.

6. The thinning method of claim 1, wherein two grooves are formed after the anisotropy etching process, the reinforcing wall formed on the second surface is polygonal, circular or conical.

7. The thinning method of claim 1, wherein the grooves formed in the second surface are polygonal, circular, or conical.

8. A thinned wafer, comprising:
a first surface, having a semiconductor device formed thereon;
a second surface, having a plurality of grooves formed therein, and at least one first reinforcing wall being formed between the grooves; and
a side surface, connected between the first surface and the second surface, wherein a bottom region of the grooves covers a scribe line defined in the thinned wafer.

9. The thinned wafer of claim 8, wherein a vertical distance between a bottom of the grooves and the first surface is greater than 0 and less than 400 micrometers.

10. The thinned wafer of claim 8, wherein a vertical distance between a top of the reinforcing wall and the first surface is less than a vertical distance between the first surface and the second surface.

11. The thinned wafer of claim 8, wherein the plurality of grooves includes two grooves, and one first reinforcing wall is formed between the two grooves, and the first reinforcing wall extends across a centre of the thinned wafer and is connected with the side surface.

12. The thinned wafer of claim 8, wherein more than two grooves are formed in the second surface, and a plurality of reinforcing walls are formed between the grooves, the plurality of reinforcing walls includes the first reinforcing grooves and are orthogonal to each other.

13. The thinned wafer of claim 8, wherein the second surface is divided into a plurality of regions of equal area, and each of the regions having different number of the grooves.

* * * * *